United States Patent [19]
Vehanen et al.

[11] Patent Number: 6,048,398
[45] Date of Patent: Apr. 11, 2000

[54] DEVICE FOR EPITAXIALLY GROWING OBJECTS

[75] Inventors: Asko Erkki Vehanen, Espoo, Finland; Rositza Todorova Yakimova; Marko Tuominen, both of Linköping, Sweden; Olle Kordina, Sturefors, Sweden; Christer Hallin, Linköping, Sweden; Erik Janzén, Borensberg, Sweden

[73] Assignees: ABB Research Ltd., Zurich, Switzerland; Okmetic Ltd., Espoo, Finland

[21] Appl. No.: 08/543,555

[22] Filed: Oct. 16, 1995

[51] Int. Cl.[7] .................................................. C30C 35/00
[52] U.S. Cl. .............................. 117/200; 117/90; 118/715
[58] Field of Search ................................... 117/2, 84, 90, 117/200; 118/715; 437/100

[56] References Cited

PUBLICATIONS

Kordina et al., A novel hot–wall CVD reactor for SiC epitaxy, Inst. Phys. Conf. Ser. No. 137, Chapter 1, pp. 44–44 (Paper presented at the 5th SiC and Related Materials Conf., Washington, DC 1993.

Kordina et al., Technical Digest of International Conference on SiC and Related Materials—95, Kyoto, Japan 1995. High Temperature Chemical Vapour Deposition.

Kordina et al., Growth and Characterisation of Silicon Carbide Power Device Material, Paper I, pp. 47–59, Linkoping Studies in Science and Technology, Dissertations No. 352, Department of Physics and Measurement Technology, Linkoping University, Sweden 1994.

*Primary Examiner*—Felisa Garrett
*Attorney, Agent, or Firm*—Pollock, Vande Sande & Amernick

[57] ABSTRACT

In a method for epitaxially growing objects of SiC, a Group III-nitride or alloys thereof on a substrate (13) received in a susceptor (7) having circumferential walls (8) these walls and by that the substrate and a source material (24) for the growth are heated above a temperature level from which sublimation of the material grown starts to increase considerably. The carrier gas flow is fed into the susceptor towards the substrate for carrying said source material to the substrate for said growth. At least a part of said source material for said growth is added to the carrier gas flow upstream the susceptor (7) and carried by the carrier gas flow to the susceptor in one of a) a solid state and b) a liquid state for being brought to a vapor state in a container comprising said susceptor by said heating and carried in a vapor state to said substrate for said growth.

14 Claims, 3 Drawing Sheets

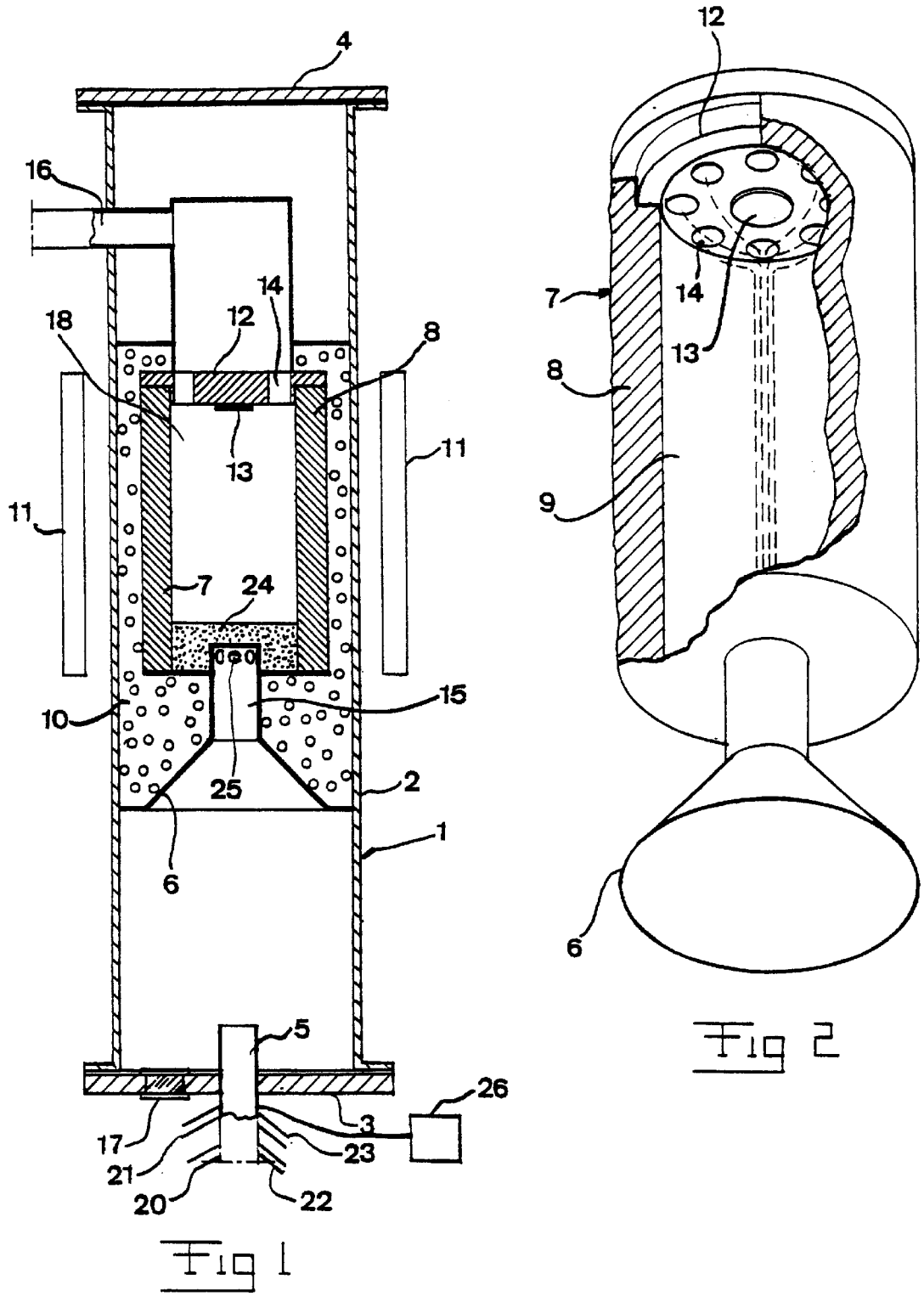

DEVICE FOR EPITAXIALLY GROWING OBJECTS

TECHNICAL FIELD

The present invention relates to a method for epitaxially growing objects of one of a) SiC, b) a Group III-nitride and c) alloys thereof on a substrate received in a susceptor having circumferential walls, in which these walls, and by that the substrate and a source material for the growth, are heated above a temperature level from which sublimation of the material grown starts to increase considerably, and a carrier gas flow is fed into the susceptor towards the substrate for carrying the source material to the substrate for the growth, as well as a device for epitaxially growing such objects.

The invention is applicable to the growth of SiC, Group III-nitrides, and all types of alloys thereof, but the common problem of growing such objects of a high crystalline quality and at a reasonable growth rate from the commercial point of view will now by way of a non-limitative example be further explained for SiC.

BACKGROUND OF THE INVENTION

SiC single crystals are, in particular, grown for use in different types of semiconductor devices, as for example different types of diodes, transistors and thyristors, which are intended for applications in which it is possible to benefit from the superior properties of SiC in comparison with, especially, Si, namely the capability of SiC to function well under extreme conditions. The large band gap between the valence band and the conduction band of SiC makes devices fabricated from the material able to operate at high temperatures, namely up to 1000° K.

There are different techniques known for the epitaxial growth of Silicon Carbide. The technique of seeded sublimation growth is at present commonly used for growing Silicon Carbide crystals for subsequent substrate production. This technique is limited both with respect to crystalline quality and purity.

The substrates produced by this method are perforated with holes called "micropipes" and have additionally a mosaic structure related to grains of slightly different crystal orientation.

The growth of the crystals is made by subliming a source powder of SiC in a container. The SiC vapors are transported to the seed crystal by an artificially applied thermal gradient. The growth rate is determined by the degree of supersaturation of the vapors in the atmosphere around the seed crystal, which in turn is determined by the temperature, the applied temperature gradient and the pressure in the system. The vapor transport is thus characterized by diffusion processes and convection. Low pressures in the container are needed for making the transport of the sublimed SiC powder effective, while avoiding too many collisions of the vapor SiC on its way to the seed crystal. The obtained growth rates with such a system is in the order of a few mm/h. Typical temperatures, temperature gradients and pressures are in the order of 2400° C. for the source material, 10–30° C./cm and 5–50 millibar, respectively. The ambient is normally Ar. The advantage with this method is its simplicity. The disadvantage with the method is the limited control of the system, the unsatisfactory crystalline quality, and the low purity which largely is governed by the purity of the source material and which indeed may be improved by the choice of a purer source material. Due to an inevitable escape of Si from the quasi-closed container, the C/Si ratio of the vaporised source material cannot be kept constant during the entire growth. This affects the growth in a negative way and cause crystalline defects. In order to grow crystals of significant size for subsequent substrate production, the growth must also be interrupted from time to time to refill the container with new source material. These interruptions also disturb the growing crystal. During growth, the presence of the temperature gradient at the growth interface causes formation of crystalline defects such as micropipes, dislocation and point defect agglomerates.

Another technique used for the epitaxial growth of Silicon Carbide layers is the Chemical Vapor Deposition technique, which in terms of purity and crystalline quality is far superior to that of the seeded sublimation growth. The gas needed for the growth is transported to the substrate by a carrier gas, normally hydrogen. The precursor gases used are, in the SiC case, normally silane and propane. The precursor gases decompose or are cracked, and the silicon and carbon consituents migrate on the growing crystal surface to find a proper lattice site. The temperature of the system is normally kept below 1600° C. Essentially no temperature gradient is present in the growth front of the crystal.

The advantage with the CVD process is the purity and the crystalline quality which mainly is limited by the substrate quality. The disadvantage with the CVD technique is the low growth rates which rules out any possibility of growing crystals for substrate production by this technique, or even thick high quality layers at a commercially interesting capacity. The typical growth rates of CVD grown SiC epitaxial layers are in the order of several gm/h at 1600° C.

Recently another process, namely the High Temperature Chemical Vapor Deposition (HTCVD) process has been presented (paper of High Temperature Chemical Vapor Deposition released on Technical Digest of Int'l Conf. on SiC and Related Materials -ICSCRM-95-, Kyoto, Japan, 1995 and the US patent application Ser. No. 08/511 324). This process is technically a CVD process carried out at very high temperature where sublimation and etching of the seed crystal (substrate) and growing crystal or layer is significant.

The etching of the growing surface has been shown to improve the crystalline quality. Also due to the purity of the precursor gases the purity of the grown crystals is very high. The growth rate can be increased to the order of a few mm/h due to the increased surface mobility of the atoms which thereby find their correct lattice sites faster. In the HTCVD process the temperatures are in the order of 1900° C.–2500° C. used.

The advantage with the HTCVD process is the high purity, the high crystalline quality and also the high growth rate. The disadvantage with the technique is the difficulty to establish favorable conditions for growth in an artificial way by adding silicon and carbon precursor gases in the correct amount at all times, is during the temperature increase, to the growth temperature and during growth. If too small an amount of precursor gases is added, a too high degree of etching or sublimation may occur, which thereby may cause a graphitization of the crystal surface which will, in turn, cause crystalline defects or even totally prevent growth. If too high an amount of precursor is added, the supersaturation may be too high for the surface mobility and the growth may be polycrystalline.

The conditions must thus artificially be kept close to a thermodynamical equilibrum, which may be very delicate to achieve. The solution to this problem is given in a copending patent application filed by the applicant the same day as the present application. This technique has been considered to form the state of the art while drafting the preambles of the appended independent claims, although the inventional technique defined below is, in fact, no type of CVD technique.

Another problem is the transport of source material for the growth to the susceptor, which in the HTCVD-process is carried out for growing SiC is the transport of silane. The silane may decompose at an early stage and result in a total or partial plugging of the gas tube leading to the susceptor or a complete depletion of the gas which will disable growth. Furthermore, there is a risk of explosions when silane is used in high concentrations.

SUMMARY OF THE INVENTION

The object of the present invention is to provide a solution to the latter problems discussed above by providing a method and a device making it possible to epitaxially grow objects, both layers and boules of SiC, a Group III-nitride or alloys thereof at a high growth rate while still obtaining a high crystalline quality of the object grown and solve these problems.

This object is, in accordance with the invention, obtained by providing a method defined in the introduction with the steps of adding at least a part of the source material for the said growth to the carrier gas flow upstream of the susceptor, and carrying it by the carrier gas flow to the susceptor in one of a) a solid state of b) a liquid state for being brought to a vapor state in a container comprising the susceptor by the heating and carried in a vapor state to this substrate for the growth. In the SiC case, it is possible to, in this way, avoid a premature decomposition of the silane in the tube leading to the growth chamber and/or a total depletion of the silane, by adding liquid or solid state source material to the carrier gas flow. This source material may, for instance, be Si, C, SiC, or combinations thereof, preferably in a solid state as a powder. The most favored proposals are to make these additions as Si and C (graphite powder) or as SiC powder. Since the melting temperature of Si is 1414° C., the Si will be much more efficiently introduced into the growth chamber without any premature reactions in the tube which could completely block the line as in the case when silane is used as the precursor.

Based on these additions the transport of the source material is more efficient than when silane is used as source material, since increasing the gas pressure of silane in the gas mixture fed to the susceptor too much with the objective of obtaining a high growth rate will cause silane to be transported through the susceptor without any cracking or growth. With respect to the seeded sublimation technique, source material may in this way be added to the carrier gas so that crystals of unlimited length may be grown without interruption.

According to another preferred embodiment of the invention, at least a part of the source material is present in a solid state in the container as the material is grown and brought to a vapor state by the heating and carried in a vapor state by the carrier gas flow to the substrate for the growth. The definition "as the material grown" is to be interpreted so that when, for instance, SiC is grown, said part of the source material is SiC in a solid state. Thus, the inventional method is an improvement of the High Temperature Chemical Vapor Deposition technique, making it to a hybrid of that technique and the seeded sublimation technique utilizing the advantages of each of these techniques. Since this type of source material is present in a solid state in the container, good control of a broad parameter range is obtained, so that a high quality crystal may be grown at a high growth rate.

The Si and C containing vapors created either by etching or by sublimation of the SiC will be brought to the substrate by the carrier gas, or by the carrier gas in combination with a thermal gradient. Conditions close to thermodynamical equilibrium can thus be obtained at all times and throughout the whole growth cycle, provided that there is at all times a significant amount of SiC present in the growth chamber. No artificial means of creating a thermodynamical equilibrium are thus required during the temperature ramp to the growth temperature. This improvement makes it simple to grow SiC boules without any temperature gradient.

It is possible to benefit from the advantages of the seeded sublimation technique of obtaining high growth rates without being forced to accept the disadvantage of that technique associated with the use of the temperature gradient for obtaining the transport of the vapor state source material, since the said carrier gas flow is used for this transport.

The introduction of the carrier gas for the transport of the source material vapor is a key issue, and in the present case, it is superfluous to add any precursor gases to the carrier gas. The growth will, in the case of no addition of source material to the carrier gas flow upstream the container stop once the exposed surface of the SiC source material becomes too small to maintain as supersaturation. The carrier gas transport, together with a proposed modification, involves a number of advantages:

The transport of the source material will be much more efficient which means that the growth rates can be raised substantially in comparison to the seeded sublimation technique. For maintaining high growth rates, considerably smaller temperature gradients or even no temperature gradients at all need to be applied, thus enabling a significantly improved crystalline quality. The vapor transport can be very easily controlled by increasing or decreasing the flow of the carrier gas. The degree of supersaturation can be kept at a controllable level at all times. If the thermal gradient is made negative, i.e. the substrate is at a higher temperature than the source material, controlled etching is also possible. The negative thermal gradient will not cause a problem once growth is desired since the transport of the source material by a carrier gas is so much more efficient than a thermal gradient.

Dopants may be easily added to the carrier gas in a manner similar to that of CVD. Since the gases pass through the container, much material will be lost and deposited or transported to other parts of the container. These losses can, however, be assumed to be essentially equal for both the silicon and carbon containing vapors which will simplify the maintenance of a constant C/Si ratio. In this embodiment, the growth rate may simply be controlled by controlling the temperature to which the susceptor walls are heated and the flow rate of the carrier gas flow. The definition "container" is to be interpreted as an object defining a room in connection with the susceptor room, in which a temperature above the temperature level from which sublimation of the material growth starts to increase considerably prevails. Thus, a container may be the same as the susceptor, or besides, the susceptor may also comprised a room directly upstream of the susceptor room. It is emphasized that the corresponding reasoning is valid also for the cases of growing objects of other materials than SiC.

In this way, it may be ensured that never all solid state source material in the container will in no instanced be consumed; instead but there will always be a buffer of solid state source material of the material grown present in the container so that it will never be any difficulty in maintaining a thermodynamical equilibrium in the system. If favorable thermodynamical conditions can artificially be achieved, then at all times one may omit the SiC source material in said container and the system will be essentially the same as the HTCVD in the cases when the source material is added as a solid or as a liquid to the container.

The corresponding characteristics and advantages thereof are found in a device for epitaxially growing objects according to the invention and defined in the appended device claims.

Further preferred features and advantages of the device and method according to the invention will appear from the following description and the other dependent claims.

BRIEF DESCRIPTION OF THE DRAWINGS

With reference to the appended drawings below follows a specific description of preferred embodiments of the invention cited as examples. In the drawings:

FIG. 1 is a longitudinal cross-section view of a device according to a first embodiment of the invention, FIG. 2 is a perspective view of the susceptor used in the device of FIG. 1 according to a first preferred embodiment adapted for epitaxially growing layers, parts of the susceptor walls being broken away to illustrate the interior of the susceptor.

DETAILED DESCRIPTION OF PREFERRED EMBODIMENTS OF THE INVENTION

Figure 3:
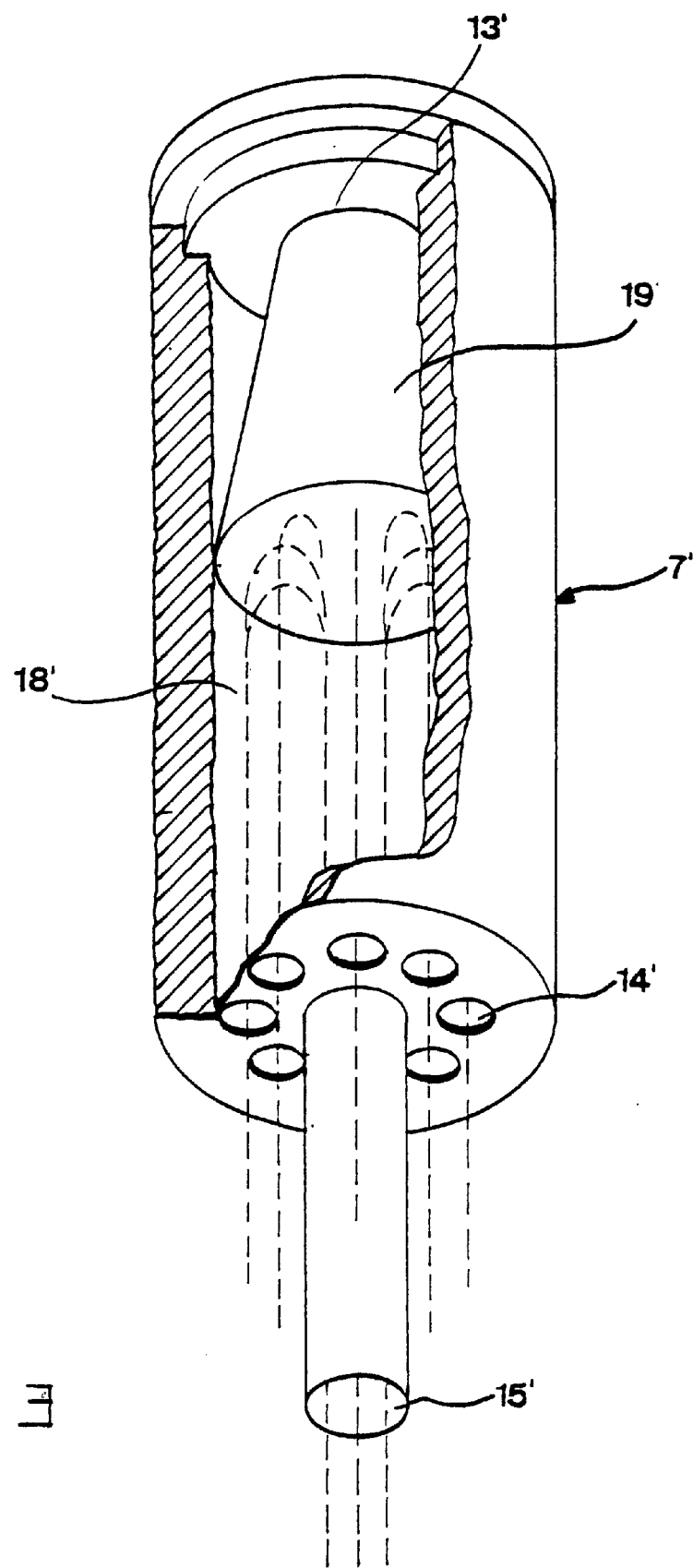
FIG. 3 is a view similar to FIG. 2 of a susceptor according to a second preferred embodiment adapted for growing boules by the same inventive method as used for the growth in the embodiment according to FIGS. 1 and 2.

FIG. 1 shows schematically a device according to a preferred embodiment of the invention for epitaxially growing SiC by a method according to a preferred embodiment of the invention being a hybrid of seeded sublimation and High Temperature Chemical Vapor Deposition on a SiC-substrate in a simplified manner. It is obvious that the device in question also comprises other means, such as pumps, but conventional equipment having nothing to do with the invention has been omitted for the sake of clarity and concentration on the inventive features.

The device comprises a casing 1 constituted by a tube 2 of quartz extending substantially vertically and having two opposite end flanges 3 and 4. The end flange 4 is preferably removable to permit access to the interior of the tube 2. A conduit 5 for supplying a stream of at least a carrier gas intended for the transport of source material for said growth to the substrate inside a susceptor is introduced through the lower end flange 3. The composition and task of this gas mixture containing at least a carrier gas will be discussed more in detail further on. The conduit 5 is connected to separate conduits 20–23 leading to sources for different additions of source material for said growth to said carrier gas. These conduits are provided with flow regulating means (not shown) for regulating the content of each component in said gas mixture as desired. Such flow regulating means will also be there for the carrier gas flow. The conduits 20–23 are, in FIG. 1, for the sake of clarity illustrated as emerging into the conduit 5 close to the casing 1, but in practise they may be at a greater distance therefrom.

Furthermore, the device comprises a funnel 6 for concentrating the gas flow from the conduit 5 into a susceptor 7 (see also FIG. 2). The susceptor 7 shown in FIGS. 1 and 2 is adapted for epitaxially growing layers of SiC. The susceptor is substantially cylindrical with circumferential walls 8 of a substantially uniform thickness. The walls are made of graphite, but are internally coated by a layer of SiC 9, or alternatively covered by a cylindrical plate made of SiC. The space surrounding the susceptor is enclosed and filled by graphite foam 10 to provide thermal insulation for protecting the surrounding quartz tube 2. Rf-field radiating means 11 in the form of an Rf-coil surrounds the tube 2 along the longitudinal extension of the susceptor 7. This heating means 11 is arranged to radiate an Rf-field fir uniformly heating the walls 8 of the susceptor and thereby the gas mixture introduced into the susceptor.

The susceptor 7 comprises a lid 12 of the same material as the rest of the susceptor, on the lower side of which a SiC substrate 13 is arranged, and which may be removed from the rest of the susceptor to remove the substrate after a layer has been grown thereon. The lid 12 is provided with peripheral gas outlet holes 14 so that a preferable laminar gas flow will enter the susceptor room 18 through the lower inlet 15 and flow close to the substrate, and leave the susceptor through the upper outlets 14 and then the device through a conduit 16 connected to a pump not shown.

The temperature inside the susceptor 7 may be checked pyrometrically through by into the susceptor 7 through a window indicated at 17.

In the bottom of the susceptor at least a part of the source material for the growth is located in the form of a SiC powder with high purity. The funnel 6 has circumferential openings 25 for the passage of the flow of the gas mixture into the susceptor room 18.

The function of the device is as follows:

The heating means 11 heats the susceptor walls 8, and by that, the susceptor room 18 and the substrate 13 and the SiC powder 24 contained therein are heated to a temperature above the temperature level from which sublimation of the SiC starts to increase considerably, in the present case to a temperature of about 2300° C. This means that SiC powder will sublime and so will the SiC of the substrate. A gas flow containing a carrier gas, which may be $H_2$ or Ar, is fed to the susceptor room 18 through the conduit 5 and the funnel 6. The definition of carrier gas is a gas not actively participating in the growth, i.e. not having components which are grown into the object of the substrate.

The carrier gas flow will carry SiC powder sublimed and being present in the vapor state in the susceptor room 18 towards the substrate 13, so that no temperature gradient is necessary for the transport of the SiC vapor to the substrate. The Si and C which escape with this system will be large; however, it may be kept at a reasonable level since atmospheric pressure operation is possible. The SiC vapor carried in this way to the substrate will form an atmosphere around the substrate having a certain "SiC gas pressure" which will counteract sublimation of SiC from the substrate and etching thereof. In this way, it is ensured at all times that a supersaturation is maintained and that no etching of the substrate occurs, so that a SiC crystal of high quality may be grown on the substrate at high growth rates. It turns out that there is no problem in growing an object of 0,5 mm/hrs at 2300° C. in this way and probably much higher growth rates may be envisaged. Would this so called SiC atmosphere not be provided around the substrate, the following may happen: all SiC begins to sublime at a a high enough temperature, which means that SiC components from the substrate will leave the substrate at a higher rate than the carbon so that a film of graphite is formed on the substrate.

In the Chemical Vapor Deposition case Si-Lynha, and C-containing precursor gases must be supplied at a correct carefully controlled ratio in the beginning of the said growth. If this is not done, the result of the growth may be very bad or the growth will, in the worst case be impossible.

The parameters needed for the control of the growth rate may, in the method according to the invention, be easily controlled within a vast parameter range, so that an adequate control of the relevant parameters is always ensured.

There are two main parameters for controlling the growth rate, namely the temperature inside the susceptor and the carrier gas flow rate. The temperature inside the susceptor may be controlled by controlling the heating means 11, and the growth rate and quality of the crystal grown may be raised with temperature. However, higher temperatures also involve a risk of impurities coming out of the walls of the susceptor. The carrier gas flow rate will control the flow of vaporized SiC to the atmosphere around the substrate. The growth rate may, by controlling the carrier gas flow, be very effectively varied, and the device comprises for this sake, means 26 schematically indicated for allowing regulation of the flow rate of the carrier gas flow. A higher carrier gas flow rate, results in a higher growth rate, but too high growth rates may involve the risk of a lowered quality of the material grown.

The substrate should not have a higher temperature than the SiC powder, since this would mean a temperature gradient normally resulting in transport of SiC to the colder region, i.e. towards the SiC powder. However, in this case the carrier gas flow is totally dominating and forces "the SiC-vapor" in the right direction, so that a positive growth always takes place regardless of a possible negative temperature gradient in the room, which easily may be the case due to the vertical arrangement of the susceptor.

Furthermore, the ratio of Si- and C-containing molecules can be kept constant in the susceptor room 18 by additions of silane and propane into the carrier gas through the conduits 22 and 23. However, the silane may partially be decomposed or cracked on its way to the casing 1, which will lead to at least partial plugging of the conduits in question and a degraded and less reliable function of the entire device. The risk of such cracking is higher at low gas flow rates.

This problem is however solved by adding Si or SiC as a powder to the carrier gas flow through the conduit 20. In this way, also carbon or graphite could be added as a powder if this should prove to be necessary. Since Si melts at such a high temperature as about 1400° C. there is be no risk of plugging of the conduits in question. This means that Si may be fed to the susceptor room 18 in higher concentrations in the form of the Si powder than in the form of silane. Furthermore, the risk of explosions also eliminated.

All combinations of adding components to the carrier gas flow may be utilized, but it would mostly be preferred to add a powder, eventually a liquid, of, a component such as an Si powder to the carrier gas flow through the conduit 20 or 21. It would also be possible to provide means adapted to analyze the gases leaving the device through the conduit 16 so as to regulate the additions depending on the result of this analysis. This way of controlling the ratio relevant for the growth, in the SiC case the C/Si ratio, may also be successfully used when objects are grown by use of the Chemical Vapor Deposition technique, i.e. when no source material in the form of the material to be grown is present in the susceptor room.

Thanks to the method described above, the initial stage of the growth being of particular importance for the quality of the layers grown closely thereafter may be adequately controlled, and very high growth rates are thereafter achievable well in the order of mm/h. Thanks to the efficient transport obtained, a high growth rate may be obtained at these high temperatures. Thanks to the purity of the Si powder or silane and graphite or propane fed to the susceptor room by the carrier gas, the introduction of unwanted compensating acceptors into the layers grown is dramatically reduced with respect to the epitaxial growth of such layers by CVD at normal temperatures, resulting in a significant prolongation of the minority carrier lifetime in the crystals grown. This is a vital improvement for the production of high-power bipolar devices. It will in this way be possible to grow crystals at the same or higher growth rates than when the seeded sublimation technique is used, but with much higher crystalline quality and purity.

FIG. 3 shows a susceptor 7' according to a second preferred embodiment of the invention, which is adapted for growing boules 19 of SiC on a substrate in the form of a seed crystal indicated at 13'. This susceptor is intended to be incorporated in a device according to FIG. 1 in the same way as the susceptor according to FIG. 2. The susceptor according to FIG. 3 only differs from that according to FIG. 2 by the arrangement of gas outlet holes 14' at the bottom of the susceptor. Accordingly, the gas flow will, as indicated, reach the region of the SiC boules grown where the source material will be deposited and the resulting components thereof will be diverted back and leave the susceptor through the holes 14'.

SiC boules with a high crystalline quality may in this way be epitaxially grown at a sufficiently high growth rate thanks to the high temperature used. As already mentioned, there will be a thermodynamic equilibrium in the susceptor room 18' and the C/Si ratio therein may easily be held constant by any appropriate addition as discussed above. This means that the degree of supersaturation which influences both the growth rate and the formation of micropipes can be varied without any thermal gradient.

Figure 4:
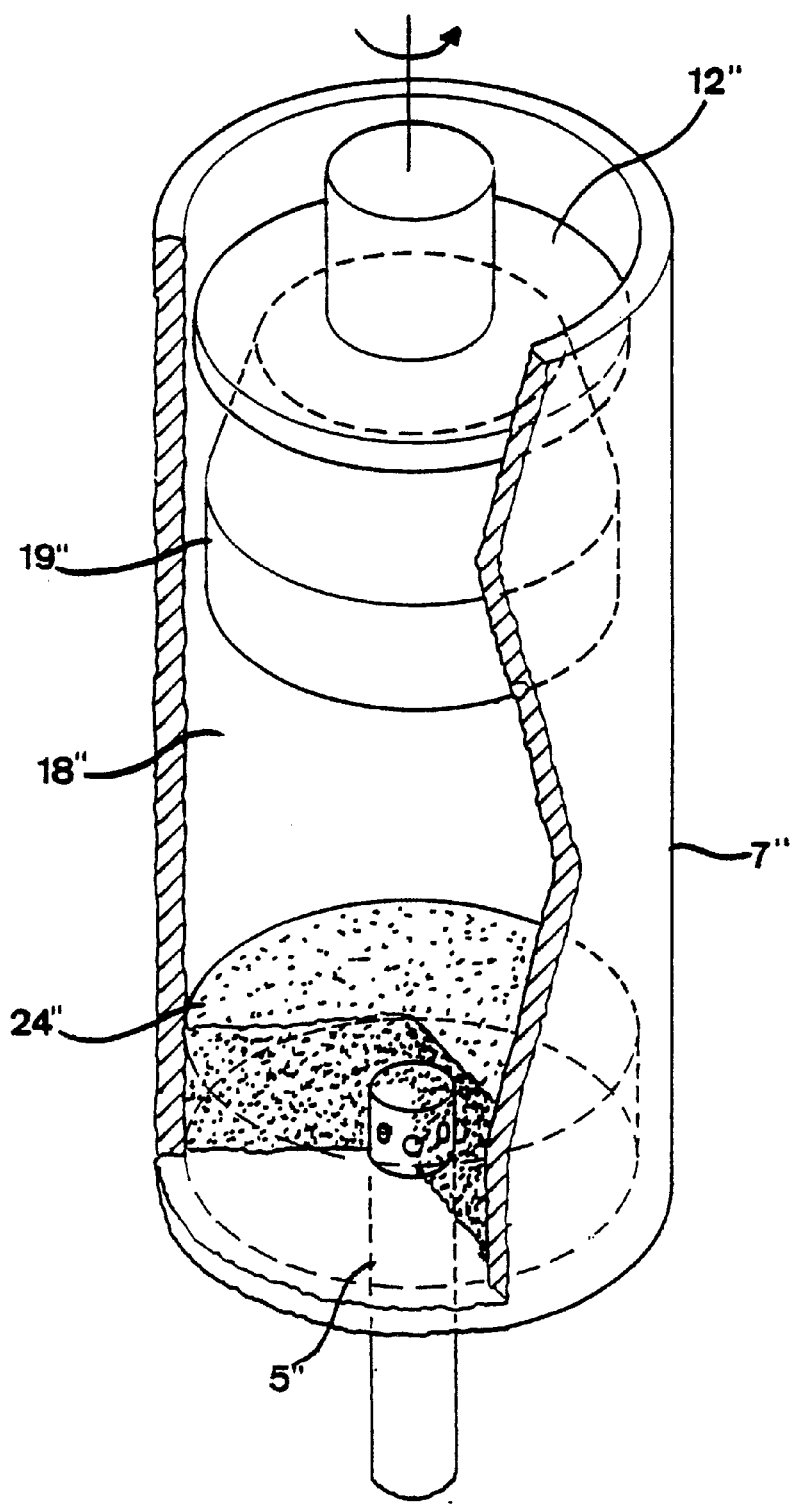
FIG. 4 is a view similar to FIG. 2 and 3 of a susceptor according to a third preferred embodiment adapted to enable the growth of boules of nearly unlimited lengths.

FIG. 4 shows a susceptor according to a third preferred embodiment of the invention. This susceptor has only one different principle feature than the other two embodiments, namely the lid 12" and by that the crystal 19" grown may be constantly raised, preferably by rotation thereof as in the Czochralski growth. Without this possibility, it would be necessary to heat a much longer susceptor room for growing long objects. Also, the great distance between the solid source material and the crystal would also be harmful with respect to depositions on the susceptor wall before reaching the crystal. In this way it may be possible to use the method according to the invention to grow boules of SiC continuously with the same quality throughout the whole growth to an unlimited length. In this embodiment, source material for said growth is added to the carrier gas flow upstream the susceptor 7 and carried by the carrier gas flow to the susceptor in a solid or liquid state for ensuring a continuous feeding of source material for the growth. Such material may be powder of Si, C and/or SiC.

A disadvantage of the method according to the invention may be the larger material losses that may be encountered when compared to seeded sublimation growth; however, thanks to the carrier gas transport the pressure may be kept at atmospheric pressure which thereby will limit these losses to some extent. The losses will essentially be governed by the gas velocity. As long as these losses do not cause a degraded function of the system by, for instance, blocking filters or tubes on the downstream side, this is a minor problem since a fresh supply of new source material can at all times be maintained.

The invention is of course not in any way restricted to the preferred embodiments of the device and method described above, but several possibilities to modifications thereof would be apparent, to one skilled in the art without departing from the basic idea of the invention.

As already mentioned, the invention is also applicable to the growth of a group III-nitride, an alloy of group III-nitrides or an alloy of SiC and one or more group III-nitrides, for which corresponding positive results may be expected.

The definition "object" in the claims is made for including the epitaxial growth of all types of crystals, such as layers of different thicknesses as well as thick boules.

All definitions concerning the material of course also include inevitable impurities as well as intentional doping.

It would of course be possible but most hardly desired, to add a part of the source material for the growth into the carrier gas flow in a liquid or vapor state instead of a solid state for bringing it to a vapor state (in the liquid state case) in the susceptor room. The choice of carrier gas is not in any way restricted to the two ones mentioned above.

It is possible to provide a source material as the material grown in the susceptor in another state than as a powder, such as lumps, or as a combination of powder and lumps. As already mentioned, this may also be obtained by providing a susceptor or container made of the material grown or internally coated thereby.

It is also possible to provide the source material last mentioned in another part of the susceptor than at the bottom thereof, and other than vertical extensions of the susceptor are possible.

The crystal may, in an alternative embodiment of the invention, be moved in the direction out of the susceptor room a way other than by screwing, for instance by displacement caused by pulling.

The definition "by heating in said container brought to a vapor state" in the claims also comprises the case in which a susceptor room is heated so that a container room upstream thereof is indirectly heated to such a temperature that the solid state source material is brought to a vapor state in the container outside the susceptor.

The definition "component" is to be understood as a part of the material grown and may not be the same as the material grown.

We claim:

1. A device for epitaxially growing objects of one of a) SiC, b) a Group III-nitride and c) alloys thereof on a substrate comprising a susceptor having circumferential walls surrounding a room for receiving the substrate, means for heating said circumferential walls and by that the substrate and a source material for the growth above a temperature level from which sublimation of the material grown starts to increase considerably and means for feeding a carrier gas flow into the susceptor towards the substrate for carrying said source material to the substrate for said growth, in that it also comprises a container comprising said susceptor and a member for adding at least a part of said source material for said growth to the carrier gas flow upstream the susceptor, said feeding means is arranged to bring the carrier gas flow to carry this added source material to the susceptor in one of a) a solid state and b) a liquid state, and the heating means is arranged to bring this added source material to a vapor state in said container by heating for carrying this added source material in a vapor state by said carrier gas flow to said substrate for said growth.

2. A device according to claim 1, wherein it further comprises a member for adding at least a part of said source material for said growth to the carrier gas flow upstream the container and said feeding means is arranged to bring the carrier gas flow to carry this added source material to the susceptor in a vapor state.

3. A device according to claim 1, wherein that said member is arranged to add said source material part to the carrier gas flow in the form of at least one component of the material to be grown.

4. A device according to claim 1, wherein it further comprises a member for adding at least one vapor state part of said source material for said growth to the carrier gas flow upstream the susceptor for cracking thereof by the heating inside the susceptor for forming a component of the material grown.

5. A device according to claim 1, wherein it is adapted for the growth of SiC.

6. A device according to claim 5, wherein said member is arranged to add one of a) Si, b) C, c) SiC, d) Si and C, e) Si and SiC, f) C and SiC and g) SiC, C and Si as a powder to said carrier gas flow.

7. A device according to claim 2, wherein said heating means is arranged to heat the susceptor walls to a temperature above 1900° C.

8. A device according to claim 7, wherein said heating means is arranged to heat said susceptor walls to a temperature between 2000° C. and 2500° C.

9. A device according to any of claim 1, wherein said providing means is adapted to provide at least a part of the source material in a solid state in the container as the material grown, and wherein said heating means is adapted to heat this solid state source material so as to bring it to a vapor state for being carried by said carrier gas flow to the substrate for said growth.

10. A device according to claim 9, wherein said susceptor (7) constitutes said container, and wherein said providing means is adapted to provide said solid state source material part in the susceptor.

11. A device according to claim 9, wherein said providing means is adapted to provide said solid state part of the source material in said container by one of a) the container is made of the material grown, b) the container is internally coated by the material grown and c) providing the material grown is provided in the container.

12. A device according to claim 11, wherein said providing means is arranged to provide said solid state part of the source material in the container as one of a) a powder, b) lumps and c) a powder and lumps.

13. A device according to any of claim 1, wherein it further comprises means for maintaining a substantially atmospheric pressure inside the susceptor.

14. A device according to any of claim 1, wherein the feeding means is arranged to feed one of a) noble gas, b) $H_2$ and c) noble gas and $H_2$ as carrier gas to the susceptor.

* * * * *